United States Patent [19]

Oguey et al.

[11] B 3,928,773

[45] Dec. 23, 1975

[54] LOGICAL CIRCUIT WITH FIELD EFFECT TRANSISTORS

[75] Inventors: Henri J. Oguey, Peseux; Eric André Vittoz, Cernier, both of Switzerland

[73] Assignee: Centre Electronique Horloger S.A., Neuchatel, Switzerland

[22] Filed: Apr. 9, 1974

[21] Appl. No.: 459,425

[44] Published under the Trial Voluntary Protest Program on January 28, 1975 as document no. B 459,425.

Related U.S. Application Data

[63] Continuation of Ser. No. 308,586, Nov. 21, 1972, abandoned.

[30] Foreign Application Priority Data

Nov. 22, 1971 Switzerland .................. 16966/71

[52] U.S. Cl. ............ 307/225 C; 307/205; 307/215; 307/251; 307/279

[51] Int. Cl.[2] ................ H03K 19/08; H03K 19/20; H03K 23/00

[58] Field of Search.... 307/205, 215, 221 C, 225 C, 307/251, 279

[56] References Cited

UNITED STATES PATENTS

| | | | |
|---|---|---|---|
| 3,493,785 | 2/1970 | Rapp | 307/255 X |
| 3,737,673 | 6/1973 | Suzuki | 307/205 |
| 3,745,371 | 7/1973 | Suzuki | 307/221 C |

*Primary Examiner*—Rudolph V. Rolinec
*Assistant Examiner*—L. N. Anagnos
*Attorney, Agent, or Firm*—Stevens, Davis, Miller & Mosher

[57] ABSTRACT

An R-S flip-flop or a binary frequency divider comprises at least one logical gate controlled by the state of variables taking one of two values neighboring the voltages at positive and negative terminals of a voltage source. The output node associated with said gate is connected to said negative terminal by a first group of n-channel field effect transistors and to said positive terminal by a second group of n-channel field effect transistors. The voltage state at said node is determined by the states of conduction of the associated first and second groups of transistors, in such a way the simultaneous blocking of the first and second groups of transistors associated with one gate is provided for at least one combination of input variables.

2 Claims, 9 Drawing Figures

LOGICAL CIRCUIT WITH FIELD EFFECT TRANSISTORS

This is a continuation, of application Ser. No. 308,586, filed Nov. 21, 1972, and now abandoned.

The invention relates to logical circuits with field effect transistors, such as metal-oxide-semiconductor transistors (MOST). Logical circuits with MOST are classified into the following general categories:

A. Association of MOST of a single type and load resistors. This type of circuit is described at page 313 of "Field-Effect Transistors" by J. T. Wallmark and H. Johnson, edited by Prentice-Hall Inc., Englewood Cliffs, N.J., 1966. The drawbacks of such circuits are numerous: high static power consumption; slow transitions; technological complications; large surface or chip area.

B. Association of active MOST and MOST with fixed polarisation, of the same type, serving as load resistor (see page 317 of the publication referred to in A). The drawbacks of these circuits are: high static power consumption; the necessity of using depletion type MOST or higher control voltages than the battery voltage.

C. Association of MOST of a single type with series capacitances ("capacitor pullup"). These circuits are described in the article "A Low-Power Multiphase Circuit Technique" by B. G. Watkins in the IEEE Journal of Solid-State Circuits, Vol. SC-2 No. 4 (Dec 1967), pages 213 to 220. These are systems with two, four or six phases serving for synchronization and power supply, and have the advantages of a zero static power consumption and a low dynamic consumption. However, they have the following drawbacks: necessity of several voltages with well determined wave forms; low speed; incompatibility with a single low battery voltage; asynchronous operation impossible.

D. Association of MOST of a single type and capacitors in parallel, in a four-phase system. These four-phase systems are described in the article "Use four-phase MOST IC logic" by J. Karp and E. de Atley in Electronic Design, Vol. 15 (April 1967) pages 62 to 66. They have the following advantages: zero static consumption; and a dynamic consumption only slightly higher than in the previous circuits; and the following drawbacks: necessity, in addition to a direct current, supply, of four dephased alternating current voltages with an amplitude greater than the direct current voltage; asynchornous operation impossible. In four-phase circuits, the capacitance of each node is charged and discharged by alternately connecting the node to the positive terminal and to the negative terminal of the voltage source by means of transistors of a single type, generally p-channel. The transitions of the voltage of each node from negative to positive take place through a transistor with its source connected to ground, which provides a rapid transition, whilst transitions of the voltage of the node from positive to negative take place through a transistor with its drain connected to ground, which produces a slower transition. These circuits thus have a limited speed of operation. In multi-phase synchronous circuits, each node capacitance is periodically recharged in synchronization with clock voltage pulses independent of the logic content of the signals. This results two drawbacks: (1) the information is not permanently available at each node; (2) numerous supplementary transitions are introduced without a corresponding change in the input information, these transistions increasing the consumption.

E. Static circuits with complementary MOST. These circuits are described in the article "Nanowatt Logic Using Field-Effect Metal-Oxide Semiconductor Triodes" by F. M. Wanlass and C. T. Sah in 1963 Int. Solid State Circuits Conf.; Digests pages 32 to 33. In this type of circuit, p-channel transistors act as "active load" for n-channel transistors, and vice-versa. It is arranged that the combination of several n-channel MOST in parallel or series has an active load composed of p-channel MOST arranged with complementary symmetry, each of the p-channel MOST being controlled by the same signal as an n-channel MOST. In this manner, whatever be the combination of input signals, there is at least one low impedance connection between each node and one of the terminals of the voltage source, whilst the connection at the other terminal is broken. The static consumption is thus zero. However, there is still a dynamic consumption proportional to the residual or stray capacitance. These circuits can thus operate asynchronously and accept input signals the amplitude of which is compatible with the direct current supply voltage. However, there is the drawback that the circuits are complex because of the number of crossing interconnections.

F. Dynamic circuits with transmission gates. These circuits are described in U.S. Pat. No. 3,577,166 (Yung); in the article "Circuit Design Considerations in High Density MOS Transistor Digital Storage" by Ball and Wood in the British publication "Symposium on application of microelectronics" (reporting a conference given at Southampton in September 1965) edited by "Institution of Electrical Engineers" (IEE Conference publication No. 14) London, 1965, pages 21/1 to 21/12; end in the article "Complementary shift register" in U.S. Publication "IBM Technical Disclosure Bulletin," Volume 13, No. 2, July 1970, pages 493 to 494. It is possible to provide shift registers by combining complementary MOST inverters (throw-over switches) with transmission gates, which are kinds of electronic switches. The transmission gates require the simultaneous application of two signals of opposite phase, which complicates the circuit. Moreover, the necessity of connecting MOST of different types in parallel does not favour integration of these circuits in different wells, since it requires numerous relatively long interconnexions.

An aim of the invention, in contrast to known four-phase circuits, is to charge the capacitance associated with each node by connecting the node to the positive terminal of the voltage source by means of at least one p-channel transistor, and discharge this capacitance by connecting it to the negative terminal of the voltage source by means of at least one n-channel transistor. The term "at least one" is hereinabove used to designate the following possibilities:

1. A single transistor;
2. Several transistors of the same type in parallel;
3. Several transistors of the same type in series;
4. Several transistors combined in any manner, but specifically excluding any connection in parallel of an n-channel transistor and a p-channel transistor.

In contrast to known static circuits with complementary MOST, the invention aims to permit that certain combinations of input signals simultaneously block the n-channel and p-channel transistors associated with a node, allowing the node to momentarily float.

An aim of the invention is also, in comparison with the known circuits, to improve the speed of operation, and reduce the consumption and the surface or chip area by combining the dynamic principle of four-phase circuits as described in (D) above with complementary MOST as described in (E) above.

According to the invention, a logical circuit supplied by a voltage source with a positive terminal and a negative terminal, whose logical states are represented by voltages able to take two different voltage values neighbouring the voltages at the positive and the negative terminal, comprises at least one logical gate controlled by at least one input variable and determining the voltage state of a node representing its output variable. Each gate is formed by a first group of n-channel field-effect transistors connecting said output node to the negative terminal of the voltage source, and a second group of p-channel field-effect transistors connecting said output node to the positive terminal of the voltage source, each group serving to determine the voltage of said output node by its state of conduction as a function of the states of the input variables, these groups being formed in a manner such that no n-channel transistor is simultaneously connected by its source and its drain to the corresponding electrodes of a p-channel transistor. This circuit is characterised by the fact that at least one combination of input variables simultaneously prevents the conduction of both groups of transistors associated with the same logical gate.

The circuit according to the invention has the following advantages:

1. High speed, because all of the transistors operate with "grounded source." This low impedance circuit arrangement rapidly charges and discharges the nodes, which is the advantage common to the circuits of E and F above. The circuits obtained are always simpler than the circuits of E, i.e., they require a lesser number of transistors and interconnections. The capacitances of the nodes are also of lower value. Moreover, the circuits obtained may have fewer stages required to transit in cascade, which gives rise to an additional increase in speed.

2. Reduced consumption in relation to the circuit of E above by reduction of the number of elements, thus of the number of capacitances to charge and discharge, and elimination of high phase voltages and needless transitions (implicit with circuits C and D above).

3. Reduction of the surface or chip area by the elimination of transistors (case E) and connections. For example, in a frequency divider, a single input signal is sufficient, whereas the circuits of C, D and F above need at least two input signals.

4. Increase in the logic flexibility. Circuits with complementary MOS transistors require a symmetry between the n-channel part and the p-channel part of the circuit, but the condition is dispensed with in the circuit according to the invention. When a node is at a given voltage, the transistors between this node and the terminal of the battery at the same voltage may indifferently either be blocked or conducting. Numerous "indifference conditions" result, and can be used to advantage to simplify the logical circuit.

The invention, and certain prior art circuits, will now be described in detail with reference to the accompanying drawings, in which FIGS. 1 to 3 relate to known MOST circuits, and FIGS. 4 to 9 relates to circuits according to the invention. In these Figures.

Logical circuits are generally classified into two categories, combinatory circuits and sequential circuits.

A combinatory circuit supplies one or more output signals whose value (0 or 1) at a given instant only depends upon the input values at the same instant. Such a circuit does not have the faculty of memorizing previous states.

To the contrary, sequential circuits, to which the invention more particularly pertains, supply one or more output signals whose value at a given instant is not solely a function of the input values at the same instant, but also of the evolution or sequence of the input values up to the instant in question.

It is known that complementary Metal-Oxide-Semiconductor Transistors (MOST) operating in the enhancement mode are advantageously employed in the production of integrated logical circuits having very low power consumptions. At rest, the static current consumption of these circuits is due to the leakage currents of the transistors. In operation, a so-called dynamic current consumption is added, proportional to the stray capacitance of the circuit, to the operating frequency, and to the supply voltage.

Figure 1:
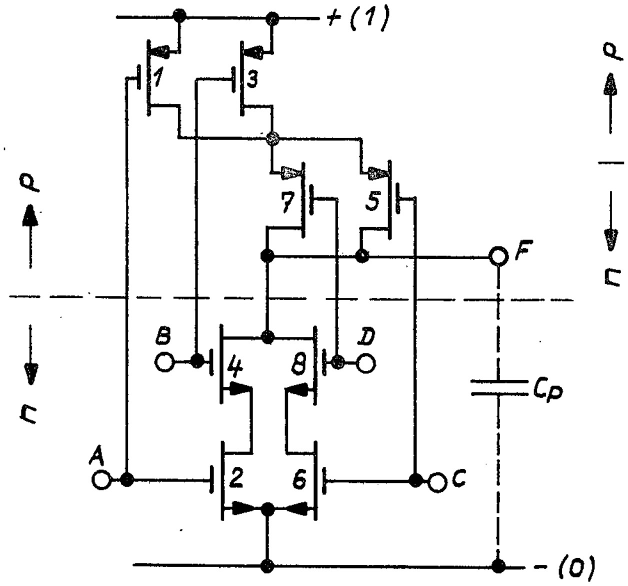

FIG. 1 of the drawings shows, by way of example, a known combinatory circuit formed of complementary MOST to carry out the logical function $$F = \overline{AB + CD}.$$

In order for the output function F to react to the variations of the input variables, A, B, C or D at the terminals designated by the same letters, the stray capacitance $Cp$ associated with the output node representing the function F must be alternatively charged or discharged. For this charging or discharging operation, a current, designated by the term switching current, must flow through some of the transistors.

For example, a transition from the state $A = 1, B = 0, C= 0, D = 0$ for which $F = 1$ to the state $A = 1, B = 1, C = 0, D = 0$ for which $F = 0$ is accompanied by a discharge of the capacitor Cp through transistors 4 and 2.

Each of the transistors is traversed by a switching current for at least one of the possible transitions; it will be seen that for sequential circuits the same is not always the case.

Figure 2:
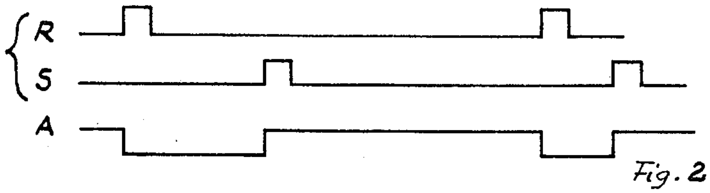

FIG. 2 of the drawings shows, by way of example, a diagram illustrating the operation of a simple sequential circuit, namely as RS flip-flop, in which the output signal A is set to the value 0 by each pulse R and to the value 1 by each pulse S.

This sequential circuit can be made by combining two combinatory circuits carrying out the equations $$\overline{A=B+R} \quad (I)$$

$$\overline{B=A+S} \quad (II)$$

where B is an auxiliary internal variable. The diagram of such a known circuit, formed with complementary MOST, is given in FIG. 3 of the drawings.

The sequence of transition of the variables for this circuit is shown in Table 1. It can be seen that the circuit has several stable states indicated in the sixth column. The passage from one stable state to another can take place through a certain number of transitory unstable states, for which at least one of the equations defining the structure is not satisfied.

Table 1

| R | S | A | B | State: transitory | State: stable | Switching transistors |
|---|---|---|---|---|---|---|
| 0 | 0 | 1 | 0 | | x | |
| 1 | 0 | 1 | 0 | x | | |
| | | | | | | 2 |
| 1 | 0 | 0 | 0 | x | | |
| | | | | | | 5;7 |
| 1 | 0 | 0 | 1 | | x | |
| 0 | 0 | 0 | 1 | | x | |
| 0 | 1 | 0 | 1 | x | | |
| | | | | | | 6 |
| 0 | 1 | 0 | 0 | x | | |
| | | | | | | 1;3 |
| 0 | 1 | 1 | 0 | | x | |
| 0 | 0 | 1 | 0 | | x | |

The final column of Table 1 indicates the reference number of the transistor(s) through which the switching current of nodes A or B flows.

An important observation to be made is that two of the eight transistors, namely transistors 4 and 8, are never traversed by a switching current and consequently do not take part in the process of switching from one state to another. Instead, they serve only to maintain the state of the variables between two switching operations.

If the time separating two switching operations is relatively short, that is to say if the frequency of the input pulses R and S is relatively high, transistors 4 and 8 can be eliminated and the capacitances associated with the nodes A and B may then serve to maintain the state of the variables.

This leads to the notion of dynamic logical circuits with complementary MOST with which the invention is more particularly concerned. The term "dynamic" is herein employed to distinguish that such circuits only operate above a certain frequency. Below this limiting frequency, the leakage currents of the various transistors would have a sufficient time to modify the charge of the capacitance at the nodes; in the above example, they would change the variable A from 0 to 1 while transistor 2 is blocked, or change the variable B from 0 to 1 while transistor 6 is blocked.

It would be possible to envisage a "semi-dynamic" structure simply by eliminating transistor 4. The circuit could then operate even at fairly low frequencies, so long as the time separating the disappearance of a pulse R and the appearance of a pulse S is short enough.

The technique of dynamic circuits is currently applied to logical circuits with MOST of a single type (p-channel only, for example) with a view to providing the smallest circuit dimensions that are possible with this MOST techniques. This technique has the drawback that charging of the capacitances takes place in one direction by a common drain connection of the MOST, which connection is of slower speed than a common source connection. Moreover, control of the transistors requires a voltage greater than the supply voltage, and the synchronous organization or arrangement of the system does not favour counting operations with very low consumption.

Figure 3:
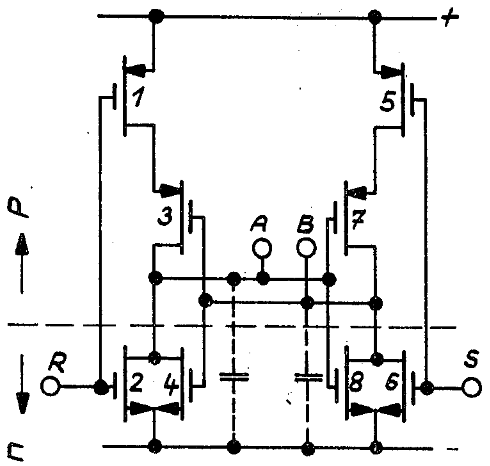
Figure 4:
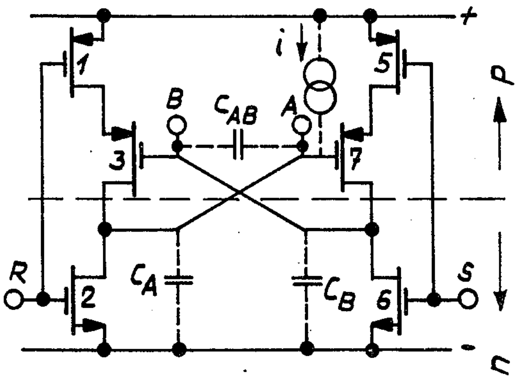
FIG. 4 is a circult diagram of a circuit operating as an R-S flip-flop.

FIG. 4 shows a dynamic circuit with complementary transistors, namely an R-S flip-flop derived from the circuit of FIG. 3, by eliminating the transistors 4 and 8, thereby only leaving p-channel transistors 1, 3, 5 and 7 and n-channel transistors 2 and 6, which, according to Table 1, are those transistors which participate in the switching operations of capacitances $C_A$ and $C_B$. On FIG. 4, the capacitances $C_A$ and $C_B$ are shown connected between the points A, B and the negative pole of the battery, but they could equally well be connected between the terminals A and B and any point at constant potential. The most rapid circuits are those in which the various capacitances are solely composed of the stray capacitances of the circuit.

Given that the potentials at A and B always vary in phase opposition, a capacitance $C_{AB}$ connected between A and B, as shown with a broken line connection, would have the same effect as the capacitances $C_A$ and $C_B$. A residual capacitative coupling between the connections associated with A and B will thus have the effect of maintaining the potential at A while the transistors 2 and 3 are blocked, since during this time the potential at B does not vary. Conversely, the capacitance $C_{AB}$ will maintain the value at B whilst the transistors 6 and 7 are blocked, since the potential at A does not vary during this time.

The sequence of transition of the variables shown on Table 1 will now be examined in further detail. The four left hand columns show the values of the input variables R and S, and the output variables A and B. For example, let us suppose that we start with the state $R=0, S=0, A=1, B=0$, as shown in the first line. It can easily be ascertained that these values are compatible with the logical equations (I) and (II), and therefore from a stable state. If the variable R is made to vary from 0 to 1, a first instant is considered when a change of A and B has not yet taken place. Then, as soon as R reaches the value 1, the equation (I) is no longer satisfied; this thus causes the transition of A from 1 to 0. At this moment, the equation (II) is no longer satisfied; this causes the transition of B from 0 to 1. Then, the two equations being satisfied, the circuit is in a stable state. The transistors 2, 5 and 7 being conducting, they maintain the potentials at A and B. When R drops back to zero, the transistors 2 and 3 block simultaneously. The potential of A floats. For the entire duration whilst R and S are at 0, the potential at A is maintained in its state solely by one of the capacitances $C_A$ or $C_{AB}$. A possible leakage current i flowing from the positive potential to the point A will gradually charge these capacitances and cause a gradual change of the potential at A. This change is acceptable as long as it does not cause an error in operation, that is to say as long as the conduction of the transistor 7 is ensured. This is the case when the following condition is fulfilled:

$$i \cdot t < C \cdot V$$

where $i$ is the maximum leakage current, t the maximum duration of the interval separating two control pulses R or S, C is the total capacitance at A, and V is the maximum voltage which still ensures correct operation of the circuit. The next pulse applied at R once more triggers the MOST 2 and brings the potential at A to 0; it thus causes a regeneration of the voltage level.

If the following positive pulse acts at the input terminal S, the circuit will pass through the states indicated on lines 6 to 8 of Table 1. The first two states are transitory, whilst the last one is permanent or stable. After disappearance of the pulse S, the transistors 6 and 7 are blocked; the potential at B floats until a further pulse is added either at R, or at S.

If the variables R and S are simultaneously equal to 1, the transistors 2 and 6 conduct and bring A and B to the lower potential. After the disappearance of R and S, the circuit will take the state corresponding to the last pulse R or S which changes from 1 to 0.

Figure 5:
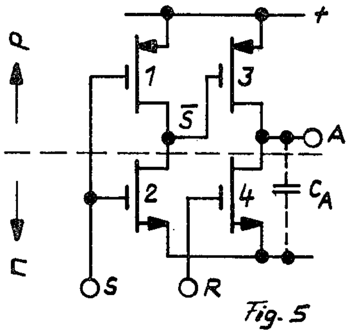
FIG. 5 shows a variant of the circuit according to FIG. 4.

FIG. 5 shows another manner of providing a dynamic RS flip-flop with complementary MOST. The functioning of this circuit is very simple. At rest, the inputs R and S are at a negative potential. Each positive pulse applied at R actuates the MOST 4 and sets A to zero. Each positive pulse applied at S, reversed by the inverter 1, 2, actuates the transistor 3 and resets A to 1. In the absence of pulses at R and S, the transistors 3 and 4 are blocked and the capacitance $C_A$ holds the state of A.

The following examples concern a particular type of sequential circuit, namely frequency dividers.

Figure 6:
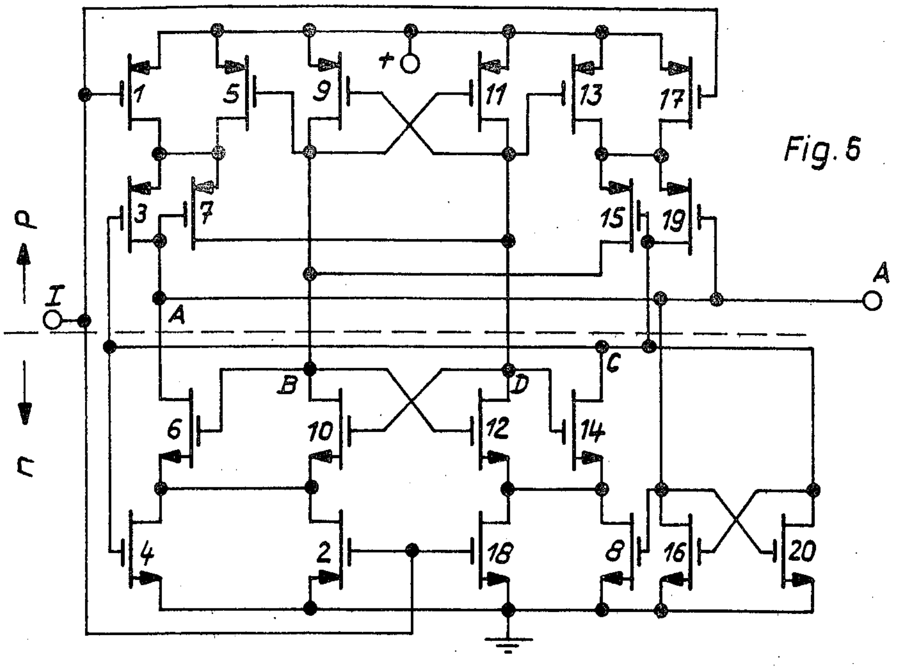
FIG. 6 is a circuit diagram of a first type of static frequency divider.

FIG. 6 shows a structure for dividing by two and conforming to the logical equations $$A = \overline{IB + C}$$
$$B = \overline{(I + C)\, D}$$
$$C = \overline{ID + A}$$
$$D = \overline{(I + A)\, B}$$

(III)

Although a circuit with bipolar transistors conforming to these logical equations is known (U.S. Pat. No. 2,945,965, Clark), the logical equations are not given in that reference, nor are the possibilities for contractions (elimination of four transistors). Moreover, bipolar transistors are not suitable for the herein described dynamic circuits, because of the base currents.

The diagram of FIG. 6 can be deduced from the above logical equations by proceeding as follows:

1. Setting up the diagram of four two level gates of the type shown in FIG. 1, each conforming to one of the above equations;
2. Making the connections between the gates;
3. Eliminating four transistors by means of four contractions according to the process explained in co-pending U.S. Patent No. 3,829,714 (Swiss Pat. Application No. 524,933).

The dividing structure thus obtained has the advantage of requiring only a single input variable, and has no essential or inherent hazard.

Table 2 shows the transitions of the variables A to D for the circuit shown in FIG. 6.

Table 2

| I | A | B | C | D | State: transitory | State: stable | Switching transistors |
|---|---|---|---|---|---|---|---|
| 0 | 0 | 0 | 1 | 1 | | x | |
| 1 | 0 | 0 | 1 | 1 | x | | |
| | | | | | | | 14;18 |
| 1 | 0 | 0 | 0 | 1 | x | | |
| | | | | | | | 3;5 |
| 1 | 1 | 0 | 0 | 1 | | x | |
| 0 | 1 | 0 | 0 | 1 | x | | |
| | | | | | | | 15;17 |
| 0 | 1 | 1 | 0 | 1 | x | | |
| | | | | | | | 8;12 |
| 0 | 1 | 1 | 0 | 0 | | x | |
| 1 | 1 | 1 | 0 | 0 | x | | |
| | | | | | | | 2;6 |
| 1 | 0 | 1 | 0 | 0 | x | | |
| | | | | | | | 13;19 |
| 1 | 0 | 1 | 1 | 0 | | x | |
| 0 | 0 | 1 | 1 | 0 | x | | |
| | | | | | | | 1;7 |
| 0 | 0 | 1 | 1 | 1 | x | | |
| | | | | | | | 4;10 |
| 0 | 0 | 0 | 1 | 1 | | x | |

Figure 7:
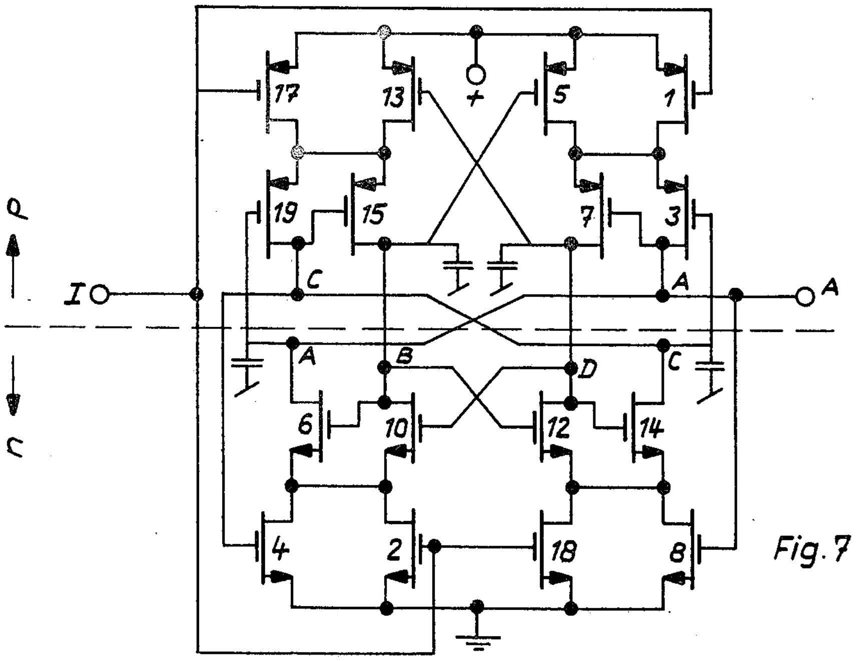
FIG. 7 shows a dynamic circuit divider obtained from the circuit of FIG. 6.

It can be observed from the final column of Table 2 that the transistors 9, 11, 16 and 20 do not take part in the switching process. These transistors can thus be eliminated which leads to the sixteen transistor dynamic structure shown in FIG. 7.

Figure 8:
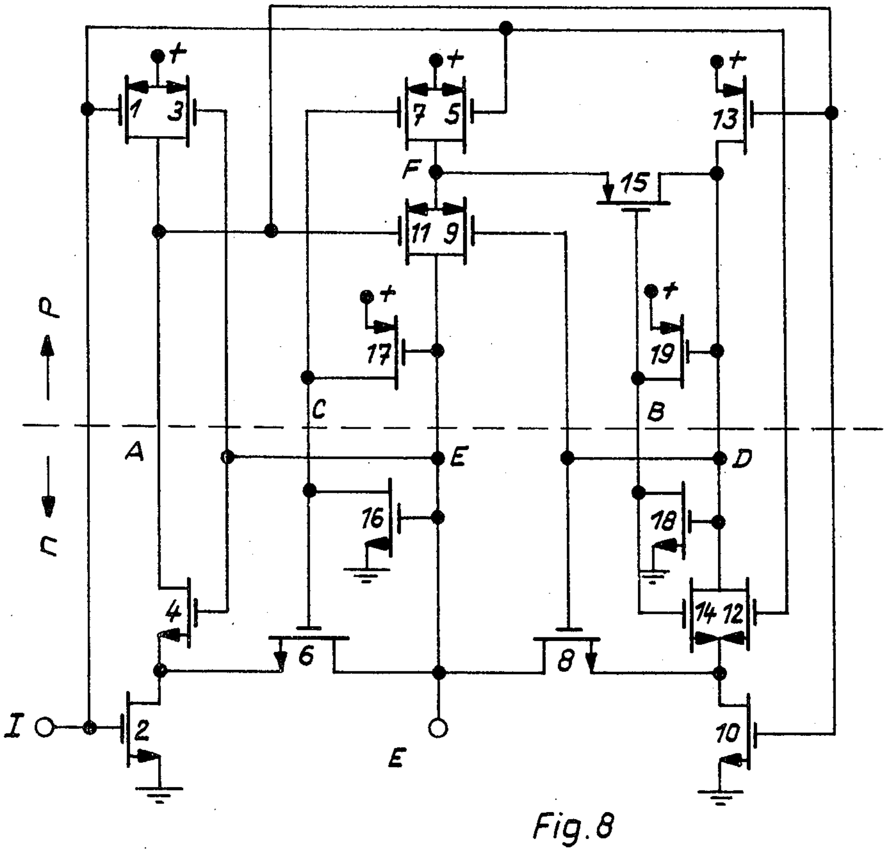
FIG. 8 is the circuit diagram of a second static frequency divider.

Another structure for dividing by two which does not require a complement of the input signal and has no essential or inherent hazard corresponds to the following equations (see U.S. Patent No. 3,829,714 Swiss Patent Application No. 524,933): $A = \overline{IE}$; $B = \overline{D}$ $C = \overline{E}$; $D = \overline{(I+B)A}$ $E = \overline{IC + AD}$ The diagram of the corresponding circuit with complementary MOST is given in FIG. 8.

Table 3 showing the transitions of this circuit reveals that the transistors 3, 6, 7, 11, 14 and 15 do not take part in the switching process.

Table 3

| I | A | B | C | D | E | F | State: transitory | State: stable | Switching transistors |
|---|---|---|---|---|---|---|---|---|---|
| 0 | 1 | 0 | 1 | 1 | 0 | 1 | | x | |
| 1 | 1 | 0 | 1 | 1 | 0 | 1 | x | | |
| | | | | | | | | | 10;12 |
| 1 | 1 | 0 | 1 | 0 | 0 | 0 | x | | |
| | | | | | | | | | 19 |
| 1 | 1 | 1 | 1 | 0 | 0 | 0 | | x | |
| 0 | 1 | 1 | 1 | 0 | 0 | 0 | x | | |
| | | | | | | | | | 5;9 |
| 0 | 1 | 1 | 1 | 0 | 1 | 1 | x | | |
| | | | | | | | | | 16 |
| 0 | 1 | 1 | 0 | 0 | 1 | 1 | | x | |
| 1 | 1 | 1 | 0 | 0 | 1 | 1 | x | | |
| | | | | | | | | | 2;4 |
| 1 | 0 | 1 | 0 | 0 | 1 | 1 | x | | |
| 1 | 0 | 1 | 0 | 1 | 1 | 1 | x | | |
| | | | | | | | | | 18 |
| 1 | 0 | 0 | 0 | 1 | 1 | 1 | | x | |
| 0 | 0 | 0 | 0 | 1 | 1 | 1 | x | | |
| | | | | | | | | | 1 |
| 0 | 1 | 0 | 0 | 1 | 1 | 1 | x | | |
| | | | | | | | | | 8;10 |
| 0 | 1 | 0 | 0 | 1 | 0 | 1 | x | | |
| | | | | | | | | | 17 |
| 0 | 1 | 0 | 1 | 1 | 0 | 1 | | x | |

Figure 9:
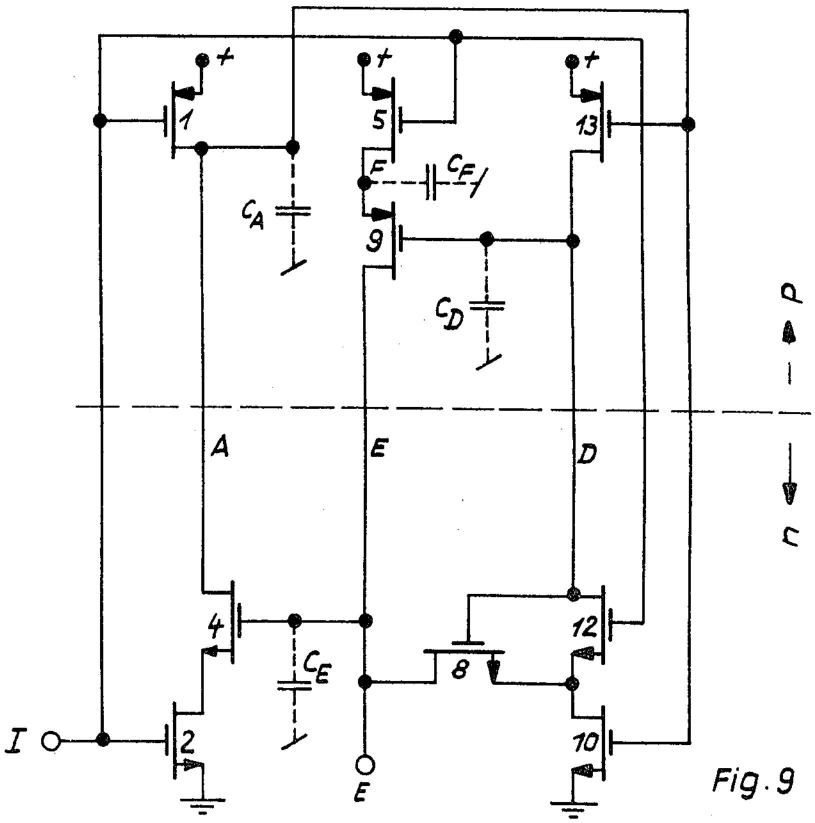
FIG. 9 shows a dynamic circuit divider obtained from the circuit of FIG. 8.

For dynamic operation, the said six transistors can thus be eliminated. It should moreover be noted that the purpose of variables B and C was only to control certain of the six transistors which have just been eliminated. These variables are no longer necessary, and it is possible to eliminate the two inverters formed by the transistors 16, 17 and 18, 19. The extremely simple dynamic circuit with nine transistors shown in FIG. 9 is thus obtained. In this circuit, the values at connections A, E and D "float" in turn and must be associated with a capacitance to hold their state. Moreover, while E floats, the variable D passes from 0 to 1 (Table 3, lines 9–10), which causes conduction of the transistor 9. The connection F common to the transistors 5 and 9 must pass from 1 to 0, which necessitates discharging the residual capacitance $C_F$ associated therewith. The holding of E in the 0 state during this phase thus requires that $C_E \gg C_F$. This condition is simple to realize if the circuit is integrated, since the ratio of the values of the capacitances is related to the ratio of the surface areas.

The above described circuits have the following general advantages.

1. In relation to known complementary MOST circuits:
   - Simpler circuits.
   - More rapid circuits due to reduction of the duration of transition times and, in some cases, the number of succesively transiting variables. Consequently, there is an increase in the limiting frequency.
   - Lower current consumption at given frequencies, and current consumption strictly proportional to the frequency.
   - Gain in the surface or chip area of integrated circuits.
   - Reduced manufacturing costs.
   - Increased reliability.
2. In relation to known dynamic circuits with MOST of a single type:
   - More rapid circuits.
   - Operation compatible with a single battery.
   - Lower current consumption at a given frequency and strictly proportional to the frequency of the signals for each stage.
   - Possibility of asynchronous logic.

What is claimed is:

1. A binary frequency divider stage circuit with insulated gate field effect transistors (MOST) powered by a constant voltage source, comprising an input I for introducing an input signal and at least three logical nodes, each logical node being an interconnection between the drains of at least one n-channel MOST and at least one p-channel MOST, each logical node being connected to control means of at least one other node and being able to be used as an output, the source of one of the MOST (1) of at least one of the nodes (A) being connected to one terminal of the voltage source and the source of the other MOST (A) of the same node being connected to the drain of a third MOST (2), the source of which is connected to the other terminal of the voltage source, the node (A) establishing the interconnection between the drains of the p- and n-channel MOST being controlled by two variables, one being the input signal and the other being the signal from an other logical node (E), in such a way that one variable (I) drives the gates of the third MOST (2) and one p-channel MOST, and the other variable drives the gate of the n-channel MOST (4), allowing the corresponding node to float when this transistor (4) as well as the complementary transistor (1) driven by the other variable are both blocked.

2. A circuit according to claim 1, comprising a positive terminal (PT), a negative terminal (NT), an input (I), an output (E), nine field effect transistors five of which (2, 4, 8, 10, 12) are n-channel and the other four of which (1, 5, 9, 13) are p-channel, each of said transistors comprising a sources (S1, etc.), a gate (G1, etc.), and a drain (D1, etc), the circuit being connected as follows: the positive terminal (PT) is connected to the source (S1) of transistor 1, to the source (S5) of transistor 5 and to the source (S13) of transistor 13;

the negative terminal (NT) is connected to the source (S2) of transistor 2 and to the source (S10) of transistor 10;

the output (E) is connected to the drain (D8) of transistor 8, to the drain (D9) of transistor 9 and to the gate (G4) of transistor 4;

the input (I) is connected to the gate (G1) of transistor 1, to the gate (G2) of transistor 2, to the gate (G5) of transistor 5 and to the gate (G12) of transistor 12;

the drain (D1) of transistor 1 is connected to the drain (D4) of transistor 4, to the gate (G10) of transistor 10 and to the gate (G13) of transistor 13;

the drain (D12) of transistor 12 is connected to the drain (D13) of transistor 13, to the gate (G8) of transistor 8 and to the gate (G9) of transistor 9;

the drain (D10) of transistor 10 is connected to the source (S8) of transistor 8 and to the source (S12) of transistor 12;

the drain (D5) of transistor 5 is connected to the source (S9) of transistor 9; and the drain (D2) of transistor 2 is connected to the source (S4) of transistor 4.

* * * * *